United States Patent
Wolter et al.

(10) Patent No.: US 10,319,688 B2
(45) Date of Patent: Jun. 11, 2019

(54) ANTENNA ON CERAMICS FOR A PACKAGED DIE

(71) Applicant: INTEL CORPORATION, Santa Clara, CA (US)

(72) Inventors: Andreas Wolter, Regensburg (DE); Saravana Maruthamuthu, Munich (DE); Mikael Knudsen, Gistrup (DK); Thorsten Meyer, Regensburg (DE); Georg Seidemann, Landshut (DE); Pablo Herrero, Munich (DE); Pauli Jaervinen, Wallerfing (DE)

(73) Assignee: Intel Corporation, Santa Clara, CA (US)

( * ) Notice: Subject to any disclaimer, the term of this patent is extended or adjusted under 35 U.S.C. 154(b) by 393 days.

(21) Appl. No.: 14/361,625

(22) PCT Filed: Dec. 9, 2013

(86) PCT No.: PCT/US2013/073950
§ 371 (c)(1),
(2) Date: May 29, 2014

(87) PCT Pub. No.: WO2015/088486
PCT Pub. Date: Jun. 18, 2015

(65) Prior Publication Data
US 2016/0240492 A1 Aug. 18, 2016

(51) Int. Cl.
*H01Q 1/38* (2006.01)
*H01L 23/66* (2006.01)
(Continued)

(52) U.S. Cl.
CPC .......... *H01L 23/66* (2013.01); *H01L 21/4846* (2013.01); *H01L 23/3128* (2013.01);
(Continued)

(58) Field of Classification Search
CPC .......... H01Q 1/2283; H01Q 1/24; H01Q 1/38; H01L 23/055; H01L 23/295
(Continued)

(56) References Cited

U.S. PATENT DOCUMENTS 6,686,649 B1 2/2004 Mathews et al.
7,633,765 B1 12/2009 Scanlan et al.
(Continued)

FOREIGN PATENT DOCUMENTS

CN 1689057 10/2005
CN 102324416 1/2012
(Continued)

OTHER PUBLICATIONS

PCT Search Report and Written Opinion, PCT/US2013/073950, 11 pages, dated Sep. 5, 2014.
(Continued)

*Primary Examiner* — Trinh V Dinh
(74) *Attorney, Agent, or Firm* — Schwabe, Williamson & Wyatt, P.C.

(57) ABSTRACT

An antenna is described on ceramics that may be used for a packaged die. In one example, a package has a die, a ceramic substrate over the die, an antenna attached to the ceramic substrate, and conductive leads electrically connecting the antenna to the die.

18 Claims, 7 Drawing Sheets

(51) Int. Cl.
  *H01L 23/552* (2006.01)
  *H01L 23/00* (2006.01)
  *H01L 25/10* (2006.01)
  *H01L 21/48* (2006.01)
  *H01L 23/31* (2006.01)
  *H01L 23/48* (2006.01)
  *H01L 23/498* (2006.01)
  *H01L 25/065* (2006.01)
  *H01Q 1/50* (2006.01)
  *H01Q 1/52* (2006.01)
  *H01L 23/29* (2006.01)

(52) U.S. Cl.
  CPC ...... *H01L 23/481* (2013.01); *H01L 23/49833* (2013.01); *H01L 23/49838* (2013.01); *H01L 23/552* (2013.01); *H01L 24/17* (2013.01); *H01L 24/19* (2013.01); *H01L 24/20* (2013.01); *H01L 24/81* (2013.01); *H01L 25/0657* (2013.01); *H01L 25/105* (2013.01); *H01Q 1/38* (2013.01); *H01Q 1/50* (2013.01); *H01Q 1/526* (2013.01); *H01L 23/295* (2013.01); *H01L 24/16* (2013.01); *H01L 24/29* (2013.01); *H01L 24/32* (2013.01); *H01L 24/73* (2013.01); *H01L 2223/6616* (2013.01); *H01L 2223/6677* (2013.01); *H01L 2224/12105* (2013.01); *H01L 2224/16225* (2013.01); *H01L 2224/16227* (2013.01); *H01L 2224/16235* (2013.01); *H01L 2224/2919* (2013.01); *H01L 2224/32225* (2013.01); *H01L 2224/73253* (2013.01); *H01L 2224/73267* (2013.01); *H01L 2225/06517* (2013.01); *H01L 2225/06548* (2013.01); *H01L 2225/1035* (2013.01); *H01L 2225/1041* (2013.01); *H01L 2225/1058* (2013.01); *H01L 2924/1421* (2013.01); *H01L 2924/15311* (2013.01); *H01L 2924/181* (2013.01); *H01L 2924/3025* (2013.01)

(58) Field of Classification Search
  USPC .................... 343/702, 700 MS, 841
  See application file for complete search history.

(56) References Cited

U.S. PATENT DOCUMENTS

| | | | | |
|---|---|---|---|---|
| 7,782,624 | B2 | 8/2010 | Fujii | |
| 7,851,894 | B1 | 12/2010 | Scanlan et al. | |
| 7,945,231 | B2* | 5/2011 | Hoegerl | H01L 23/3128 257/700 |
| 8,502,735 | B1* | 8/2013 | Moosbrugger | H01Q 3/30 343/700 MS |
| 8,786,060 | B2* | 7/2014 | Yen | H01L 23/552 257/660 |
| 2005/0134507 | A1* | 6/2005 | Dishongh | H01L 23/3677 343/700 MS |
| 2009/0168367 | A1* | 7/2009 | Fujii | H01L 23/3128 361/720 |
| 2009/0322643 | A1 | 12/2009 | Choudhury | |
| 2010/0073255 | A1 | 3/2010 | Noll | |
| 2011/0298110 | A1 | 12/2011 | Pagaila et al. | |
| 2011/0316117 | A1 | 12/2011 | Kripesh | |
| 2012/0012991 | A1 | 1/2012 | Chandrasekaran et al. | |
| 2012/0062439 | A1* | 3/2012 | Liao | H01L 23/481 343/841 |
| 2012/0229345 | A1* | 9/2012 | Takaki | H01Q 1/2291 343/700 MS |
| 2013/0009320 | A1 | 1/2013 | Yoo et al. | |
| 2013/0078915 | A1 | 3/2013 | Zhao et al. | |
| 2013/0292808 | A1* | 11/2013 | Yen | H01L 23/552 257/660 |
| 2014/0028518 | A1* | 1/2014 | Arnold | H01Q 1/526 343/841 |
| 2014/0145883 | A1* | 5/2014 | Baks | H01Q 1/2283 343/700 MS |
| 2015/0070228 | A1* | 3/2015 | Gu | H01Q 1/2283 343/727 |
| 2016/0056544 | A1* | 2/2016 | Garcia | H01Q 21/28 343/725 |

FOREIGN PATENT DOCUMENTS

| | | |
|---|---|---|
| CN | 103026487 | 4/2013 |
| JP | 2006309738 | 11/2006 |
| JP | 2007129304 | 5/2007 |
| JP | 2008166373 | 7/2008 |
| JP | 2009-158742 A | 3/2010 |
| JP | 2013021628 | 1/2013 |
| JP | 2014146982 | 8/2014 |
| KR | 10-2013-005811 A | 1/2013 |
| TW | 2009-28699 | 7/2009 |
| WO | WO 2004/038679 | 5/2004 |
| WO | 2012-014527 A1 | 2/2012 |

OTHER PUBLICATIONS

Chinese Search Report from counterpart Chinese Patent Application No. 201410634848, dated Dec. 23, 2016, 2 pages.
English Abstract of CN 102324416, dated Jan. 18, 2012, Liao, Guoxian, et al., 1 page.
Office Action from Chinese Patent Application No. 201410634848. X, dated Aug. 24, 2017, 24 pgs.
Notice of Allowance from Chinese Patent Application No. 201410634848.X, dated Dec. 18, 2017, 5 pgs.
Extended Search Report from European Patent Application No. 13899094, dated Jul. 20, 2017, 15 pgs.
Office Action from Japanese Patent Application No. 2016-550450, dated Jun. 6, 2017, 18 pgs.
Notice of Allowance from Japanese Patent Application No. 2016-550450, dated Dec. 19, 2017, 4 pgs.
Office Action from Korean Patent Application No. 10-2016-7012125, dated Jul. 2, 2017, 17 pgs.
Office Action from Korean Patent Application No. 10-2016-7012125, dated Nov. 21, 2017, 4 pgs.
International Preliminary Report on Patentablity from International Patent Application No. PCT/US2013/073950, dated Jun. 23, 2016, 9 pgs.
Partial Search Report from European Patent Application No. 13899094, dated Mar. 24, 2017, 10 pgs.
Preliminary Examination Report from Malaysian Patent Application No. PI2016701486, dated Oct. 7, 2016, 2 pgs.

* cited by examiner

ANTENNA ON CERAMICS FOR A PACKAGED DIE

CROSS-REFERENCE TO RELATED APPLICATION

This patent application is a U.S. National Phase Application under 35 U.S.C. § 371 of International Application No. PCT/US2013/073950 filed Dec. 9, 2013, entitled ANTENNA ON CERAMICS FOR A PACKAGED DIE.

FIELD

The present disclosure relates to the field of radio chip packaging and, in particular, to combining antennas with ceramics for connection to chips in a package.

BACKGROUND

Semiconductor and micromechanical dies or chips are frequently packaged for protection against an external environment. The package provides physical protection, stability, external connections, and in some cases, cooling to the die inside the packages. Typically the die is attached to a substrate and then a cover that attaches to the substrate is placed over the die. Alternatively, the die is attached to a cover and then a package substrate is formed on the die. As more devices are designed to provide wireless connectivity, packages are adapted to allow antennas to be connected to the one or more chips that are inside a package. The external antenna connections increase the assembly complexity and cost of producing a device.

Antennas are typically formed on the system board for the device or on a connected PCB (Printed Circuit Board). The connection to the chip package is made via the PCB. This is a long and complex connection through the PCB, and the package substrate to reach the chip. Impedances are difficult to control and there are reflections at the interfaces. While an antenna on a PCB is inexpensive, the quality of the antenna is limited. In some cases separate external antennas are used which are more expensive to produce and package and may have even more complex connection paths.

As the sizes of wireless devices are reduced, RF (Radio Frequency) packages are placed ever closer to digital and baseband packages. The digital and baseband packages typically generate noise and interference that can disrupt or impair the operation of the RF systems. The RF packages and the antennas typically generate noise and interference that can disrupt the operation of each other and of the digital and baseband packages. As a result, components are spaced apart and shielded by metal cases that cover chips inside packages. In some cases, a package may include internal shielding to avoid interference from the digital circuitry or RF components respectively. This further increases the size and complexity of a device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
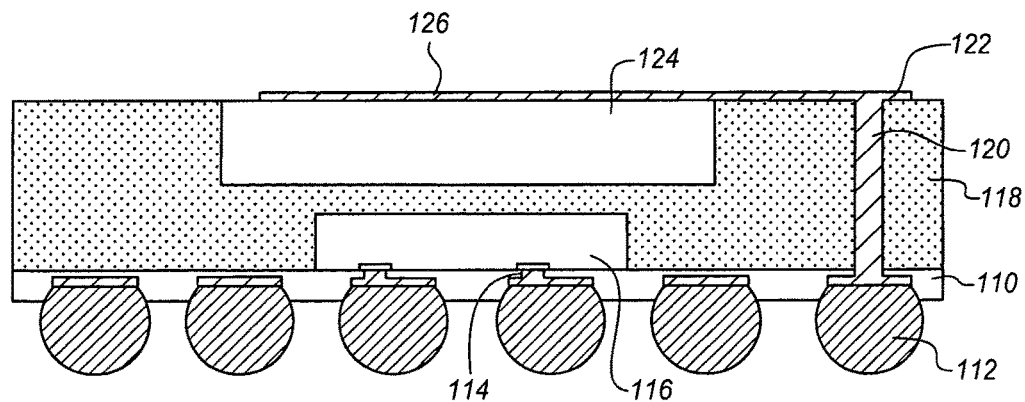
FIG. 1 is a cross-sectional side view diagram of an eWLB package with an antenna on a ceramic substrate according to an embodiment of the invention.

Integration of an antenna into a package allows for reduced cost and simpler device assembly. For a system such as a mobile phone, the package might include the antenna and an RF chip connected to the antenna. The package may also include other components, such as additional chips, passive components, redistribution layers and shielding. The chip can be connected through the package to a system board of the mobile phone and thereby to other components. An integrated antenna makes it easier to connect the antenna to the chip. It allows for easier impedance matching for the antenna and its connection. It presents a smaller form factor, higher antenna quality factor, higher antenna efficiency and improved antenna sensitivity.

As described herein, an antenna can be constructed on or in ceramic and integrated into a package or in a package on package construction. The active chip within the package may be protected from the RF emitted by the antenna by shielding integrated into the same package. This antenna in package on a ceramic substrate can be integrated into a variety of different types of packages including eWLB (embedded Wafer Level Ball Grid Array), and Flip Chip in Package, among others.

In many cases it is beneficial to use an antenna at its resonance frequency. The smallest possible dimension of an antenna in resonance is on the order of a quarter wavelength. At typical frequencies used for a mobile phone, this dimension is larger than many packages of the types of chips that are typically connected to the antenna. Therefore the antenna will not fit in or on the package unless the package is made much larger which increases the cost of the package. For example, the cost of a wafer level package increases in direct relation to the size of the package.

The size of the antenna can be reduced by forming it on a ceramic substrate. Ceramic materials are available that have high dielectric constants. The high dielectric constant allows the size of the antenna to be reduced because the resonant frequency of an antenna is related to the inverse of the square root of the dielectric constant. The ceramic materials used for class1 ceramic capacitors, for example, have dielectric constants up to 200 and loss tangents that are less than 0.005. For a PCB made of standard FR4 material the dielectric constant is about 4.2 and the loss tangent about 0.02.

A variety of different ceramic materials may be used as a ceramic substrate for the antenna. A particularly common ceramic is aluminum (III) oxide ($Al_2O_3$) which has a dielectric constant of 9 and a loss tangent of 0.0001. Low temperature co-fired ceramics (LTCC) may also be used. These may take the form of aluminum (III) oxide with some glass to allow sintering at lower temperatures. LTCCs can have a dielectric constant of about 5-16 and a loss tangent of about 0.0005 to 0.0035.

In addition, there are a variety of ceramics developed for capacitors that may be used. Both Class 1 and Class 2 capacitor ceramics may be used. The Class 1 materials may include $MgNb_2O_6$, $ZnNb_2O_6$, $MgTa_2O_6$, $ZnTa_2O_6$, $(ZnMg)TiO_3$, $(ZrSn)TiO_4$, $Ba_2Ti_9O_{20}$, among others. Class 2 materials include ferroelectric materials based on barium titanate ($BaTiO_3$) with one or more additives, such as aluminum silicate, magnesium silicate, and aluminum oxide.

A reduced size antenna formed on ceramic can be integrated into a typical sized package. As a result, the connection between the chip in the package and the antenna is much shorter than in the case of a separate antenna on a PCB. This leads to an improved overall performance. A complete system with the antenna and chip in a single package can be provided for assembly which can then simply be attached to the device system board as a single component. The antenna package may also incorporate any impedance matching for the antenna connection. This simplifies design and fabrication of the system board because removing the antenna connection from the system board removes the need to match impedances on the system board for that removed connection.

The size reduction increases the antenna quality factor Q, improving efficiency and reducing the impact of the user. The antenna is much less likely to be affected by how the device is held by a user.

When the antenna is integrated into the package, the antenna is in contact with or physically close to typical packaging materials. Many of these materials have a comparatively high loss tangent which leads to strong dissipation of the RF energy through the material reducing the antenna's efficiency and quality factor. By constructing the antenna on or in a suitable ceramic substrate these losses are reduced. For the antenna, the high loss packaging materials are replaced by low loss ceramics. The ceramics may also be highly polarized by the RF energy of the antenna. The polarization shields the RF fields of the antenna from the die and shields the RF fields of the antenna from the packaging materials. The shielding can be increased still further using metal shielding on the ceramic substrate or over the die.

While embodiments are described in which the antenna is integrated onto the package with the die. In other embodiments, an antenna on ceramics is connected as a separate POP (Package on Package) to a bottom package with the die. The modular POP approach simplifies the packaging processes and allows for independent testing of the antenna and the chip.

FIG. 1 is a cross sectional side view diagram of an eWLB (embedded Wafer Level) package with an embedded die 116 and an antenna 126 formed on top of an embedded ceramic substrate 124 or ceramic block. The package has a redistribution layer (RDL) 110 or package substrate with a number of pads for solder ball 112 connections to a system board or other components. The embedded chip 116 is attached to the package substrate 110 and has pads 114 for connection to the substrate. The RDL connects the pads 114 from the embedded chip to a system board through the solder ball array 112.

For a typical eWLB package, the chip 116 is first embedded in a mold compound also referred to as a molding compound 118. A front side redistribution layer 110 is then formed on the front side surface of the chip. The RDL may have a first dielectric layer closest to the chip, a conductor layer with metal pathways, and a solder stop layer. The chip is connected to the metal pathways by vias through the first dielectric layer. The metal pathways may be formed of any of a variety of different metals including copper, aluminum, titanium, tungsten, nickel, palladium, gold, or of metal alloys including one or more of copper, aluminum, titanium, tungsten, nickel, palladium, and gold.

A ceramic substrate 124 is also embedded into the molding compound 118. The molding compound 118 serves as a package cover and completely encloses the embedded chip for protection. A second backside RDL is formed over the mold compound and over the ceramic. It is on the opposite side of the chip from the front side RDL. The backside RDL is shown as including an antenna 126 and its connection 122 to a via 120 through the mold compound. The via 120 through the mold compound connects the antenna to the front side RDL and thereby to the embedded chip or to the solder balls for external connection. The conductive line 122 connects the via to the antenna 124 and may be used to allow the antenna to be grounded or powered or to communicate signals between the antenna and the die as desired. While only a single chip and a single through-mold via is shown, there may be many more. While only a few solder ball connections are shown, there may be many more.

The mold or molding compound may be formed of any of a variety of different materials, depending on the nature of the package and its intended use. Suitable mold compounds may include, or may consist of, a plastic material, such as a thermosetting polymer or an epoxy resin or a filled epoxy resin such as a thermosetting mold compound. Alternatively, an underfill or other material may be used to protect the die.

The chip is embedded by a molding compound or lamination with the molding compound 118. The ceramic plate 124 may be embedded into the molding compound as the molding compound is applied. For example, if the ceramic comes down on to the package substrate with the top mold chase when the mold tool is closing, then the ceramic may be embedded into the molding compound. This also allows a specifically controlled distance to be maintained between the embedded chip 116 and the ceramic substrate 124. While not shown, the antenna 126 may be connected directly to the embedded chip using connective paths or vias (not shown) or using vias through the package substrate and the mold compound such as the through-mold via 120. The package substrate 110 may be a redistribution layer (RDL) to connect the embedded chip 116 to the antenna 126 as well as connecting different connection points on the chip to each other.

Instead of an eWLB-package the package may alternatively be a flip chip package. For a flip chip package, the front side RDL is replaced by a substrate. The chip is connected to this substrate by means of a flip chip interconnect. The substrate is typically formed of silicon, or any of a variety of PCB materials such as FR4. For other package types, build-up layers with metal pathways may be used to connect different pads together and to fan out the connections on the chip to connect to corresponding pads on a circuit board or other component.

Figure 2:
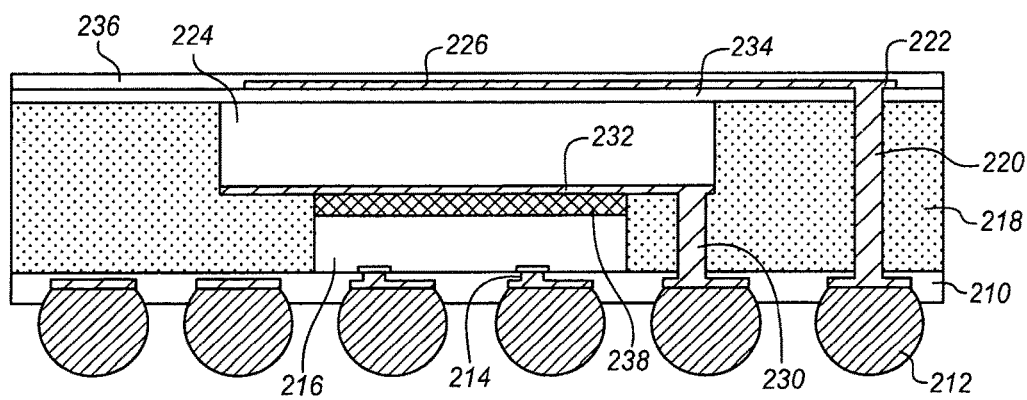
FIG. 2 is a cross-sectional side view diagram of an alternative eWLB package with ceramic substrate attached to the die according to an embodiment of the invention.

FIG. 2 shows an alternative package that includes an embedded ceramic substrate with an antenna together with some additional optional features which may be used depending on the particular embodiment. The package substrate 210 carries an embedded chip 216 that is connected electrically to the package substrate 210 using connection pads and vias 214 as in the example of FIG. 1. The package substrate 210 may be an RDL to connect connection points on the chip to a variety of solder ball connections 212 and through the solder ball connections to a system or logic board. The package is covered with a molding compound 218 which, in this example, completely covers the package substrate and the embedded chip.

The package of FIG. 2 may be assembled by first forming an antenna 226 on a ceramic substrate 224. A shielding layer 238 is then attached to the opposite side of the ceramic and the combined shielded antenna and ceramic may then be attached to the die 216 with an adhesive 238. Alternatively, a shielding layer may be formed on a ceramic substrate and the ceramic substrate then attached to the die. The antenna layer may be formed later as a part of forming the back side RDL 234, 222.

A molding compound 218 may then be applied over the assembly to produce a reconstituted wafer of molding compound with the assembly of the die and ceramic substrate. The ceramic substrate may then be exposed by back grinding the molding compound and through-mold vias may be drilled through the mold to the shield.

The front side of the die opposite the antenna is now secured by the molding compound and the front side RDL 210 may be built up over the die. The through mold vias 220 can be metal plated as well to form connections through the front side RDL. As an example, the through-mold vias to the shielding layer may be opened after opening the vias in a 1st dielectric layer of the front side RDL. After opening, a seed layer is deposited. Then a photoresist is applied to the front side and structured. Next, the vias and the front side RDL are plated together in the resist openings. Structuring is completed by etching the seed layer. Processes such as these may be repeated to build up as many interconnection layers in the RDL as desired.

Through-mold vias 220 can also be opened to the back side of the package and a back side RDL 234, 222 may be formed over the package. The vias can now connect the antenna directly through the mold compound to the front side RDL. The package can be completed by attaching the solder balls 212 and slicing through the mold compound to separate the wafer into separate packages.

Alternatively, a structure similar to that of the example of FIG. 2 may be formed as a flip-chip package. First the embedded chip is assembled with a ceramic substrate 224. The ceramic substrate may be attached to the embedded chip using an adhesive 238. The two components may be attached before the embedded chip is then attached to the package substrate 210. The ceramic may be attached to the die by an adhesive such as a die attach film (DAF) before attachment to the substrate and before molding. The prefabricated combination of chip and attach ceramic may then be embedded in the mold compound or a similar material during the molding and lamination.

After molding, the ceramic may be released from the mold compound for example by grinding. It may then still be covered with a thin mold layer. A thin dielectric can be applied instead of the mold compound, depending on the particular implementation. In this example, a shielding metal layer 238 is applied to the bottom of the ceramic substrate 224 before the ceramic is attached to the embedded chip. This shielding layer 232 may be coupled to a defined electric potential through a through-mold via 230.

After the chip and ceramic have been attached to the substrate and the molding compound has been removed up to the layer of the top of the ceramic, the antenna may be attached. In this example, a dielectric layer 234 is first applied over the top of the entire package. A through-mold via 220 which connects to an outer ground or any other desired connection is then etched through the molding compound to a corresponding pad on the package substrate 210. The antenna 226 may be formed in a particular shape and configuration over the dielectric layer and arranged to connect through a trace 222 to the antenna via 220. The entire package and antenna may then be covered with another protective layer 236, typically a dielectric layer.

Figure 3:
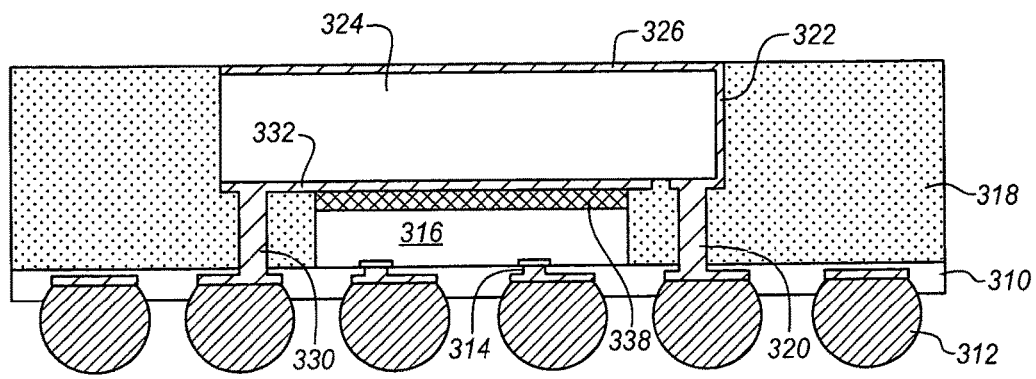
FIG. 3 is a cross-sectional side view diagram of an eWLB package with vias from the ceramic substrate direct to the front side RDL according to an embodiment of the invention.

FIG. 3 shows a further example of a package as a cross-sectional side view diagram similar to that of FIGS. 1 and 2. A package substrate or RDL 310 has a solder ball connection 312 such as a ball grid array for attachment to an external printed circuit board (PCB), system board, logic board or other external components. As in the example of FIG. 2, the ceramic substrate 324 is attached to the embedded chip 316 using an adhesive 338. The package substrate 310 is formed over connection pads on the embedded chip. Vias 314 through the substrate allow the pads on the chip 316 to connect with the package substrate and through the substrate and solder balls to external connections.

The ceramic may have a shielding layer 332 coupled to a source of potential using the through-mold vias 330. These vias may connect through the substrate to external components or power supplies. Alternatively, the vias may connect to the substrate to access potentials carried by the substrate. The shielding layer 332 is on the bottom side of the ceramic between the embedded chip and the ceramic substrate.

Figure 4:
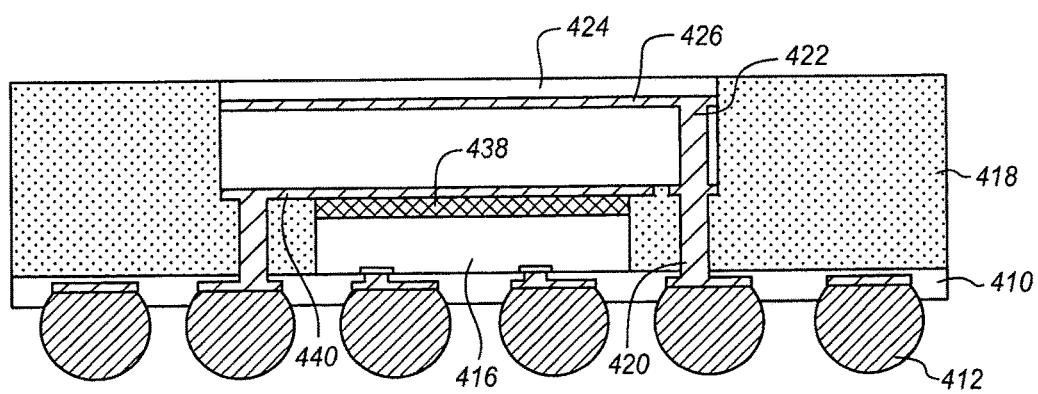
FIG. 4 is a cross-sectional side view diagram of an eWLB package with an embedded antenna in the ceramic substrate according to an embodiment of the invention.

In addition, an antenna 326 is formed over the ceramic substrate at the top of the package. However, in the contrast to the example of FIG. 2, in which a connecting trace 222 leads across the top of the package to a through mold-via which extends the entire distance through the package from the top to the bottom, in this example, a conductive trace 322 has been applied across the end and the bottom portion of the ceramic substrate. As a result, a much shorter through-mold via 320 may be used to connect the antenna signal. The via connects a portion of the bottom of the ceramic substrate to the package substrate 310. The ceramic substrate may be formed with a via through the ceramic as shown in FIG. 4 or with conductive paths 322 on an end cap. These connect to the antenna structure 326 on the top of the ceramic. The metallization that forms the conductive paths may be applied along the end cap and bottom of the ceramic before the ceramic is attached to the embedded chip. During this process, the antenna 324 and shielding layer 332 may also be applied, depending on the particular implementation.

After the die and ceramic are embedded in the mold compound, vias and the front side RDL are formed. The package may be finished in any of a variety of different ways. At this stage, the ceramics will be covered with a mold compound layer. The antenna can be exposed by a grinding of the mold compound. Grinding may also stop so that a thin mold compound layer is preserved. Alternatively, the exposed antenna may be covered by a thin dielectric.

In the example of FIG. 4 an antenna 426 is embedded into the ceramic substrate 424. The antenna is connected through a conductive path 422 in the form of a via through the ceramic. This conductive path connects to a through-mold via 420 that couples to a package substrate 410. As in the other examples, this package includes a package substrate with a ball grid array connection 412 to external components. A chip 416 embedded within the package is attached using adhesive 438 to the ceramic substrate 424. The ceramic substrate is also shown as including a bottom layer shielding 440 together with the antenna 426 embedded into the ceramic. By embedding the antenna into the ceramic, the antenna is protected from corrosion and other external damage. In addition, the ceramic may be exposed to a variety of different processes such as grinding, coating, and plating without risk of damaging the antenna.

Figure 5:
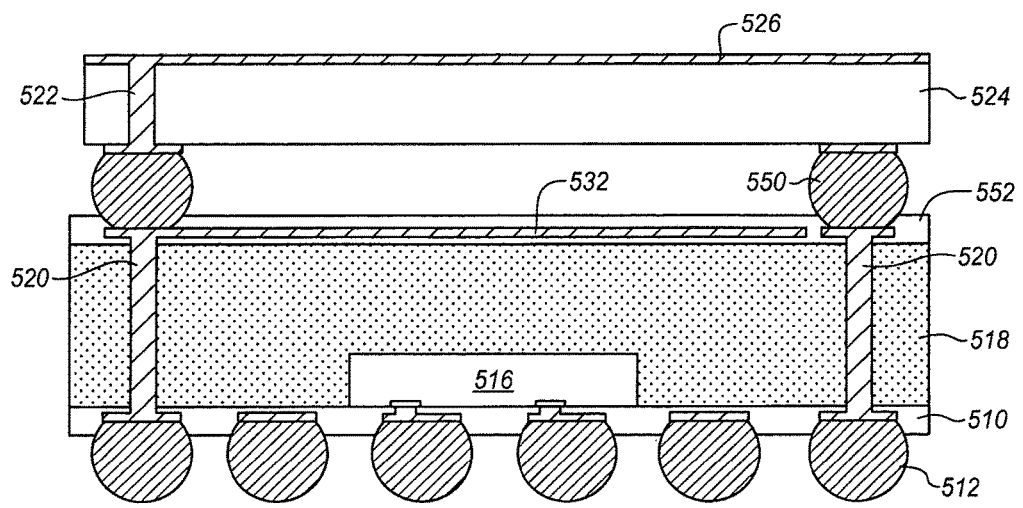
FIG. 5 is a cross-sectional side view diagram of an antenna on a ceramic substrate stacked over an eWLB package according to an embodiment of the invention.

FIG. 5 shows another alternative package design. In this case, an embedded chip 516 is in a first bottom package while a ceramic substrate 524 and antenna 526 are in a second top package. The two packages are attached as a package on package (POP). These packages may be eWLB packages, flip chip packages, embedded die packages, or any other type of package which are stacked, depending on the particular implementation. By forming the two packages separately, the different packages may be different sizes. For example the embedded antenna may be the same size or larger than the package holding the embedded chip. The connection from the bottom package to the antenna is through vias that connect the two packages together using, for example, solder balls. A variety of different package on package connection and stacking techniques may be applied depending on the particular implementation.

In the illustrated example, the bottom package is an eWLB package with through-mold vias 520 and a backside RDL 532. The backside RDL 552 consists of a metallization layer 532, a dielectric below the metallization layer and a solder stop above the metallization layer. The front side RDL 510 has a solder ball array 512 for a connection to a PCB. A front side RDL 510 is attached to the embedded chip 516 which is covered with a mold compound 518. The upper or back side redistribution layer 552 includes a top solder ball connection array 550. The solder ball connection array on the top package is much simpler than the solder ball connection array on the bottom package 512 because the top package includes only an antenna. The redistribution layer 552 may also include connections to additional chips (not shown) that may also be embedded in the bottom package. In addition, the upper redistribution layer 552 may include shielding which may or may not be connected to a specific potential. In this example, the RDL provides the shielding and includes pads for the solder ball connections to the top package. The RDL is coupled to at least one of the through mold via 520s for grounding the shield. The shielding may also or alternatively be within the RDL 552, above the RDL or below the RDL.

The upper package contains the ceramic substrate with an antenna formed on its top surface 526. It may also include vias through the ceramic 522 that connect to the bottom package through the upper solder ball array 550. These vias may then connect using through-mold vias 520 to the front side RDL 510 for connection to the chip in the bottom package and for external connection as in the previous examples.

Figure 6:
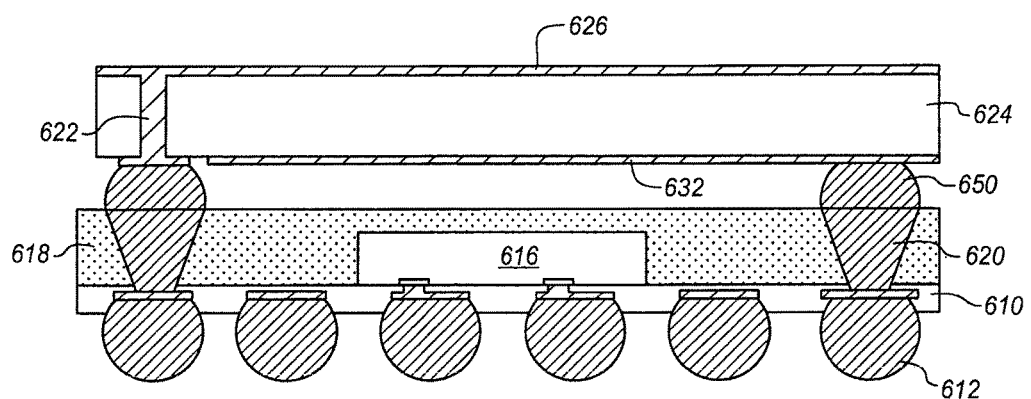
FIG. 6 is a cross-sectional side view diagram of an antenna on an alternative ceramic substrate stacked over an eWLB package according to an embodiment of the invention.

FIG. 6 shows another example of an antenna 626 formed on or over a ceramic substrate 624. In this cross-sectional diagram, another package on package approach is shown. The shielding in this case has been applied to the bottom of the ceramic substrate 624 and not to the upper RDL 552 as in FIG. 5. In addition, this example uses a bottom eWLB package with solder-filled through-mold vias 620. This allows the bottom package to be simplified by avoiding the use of a backside redistribution layer and specific solder pads.

Looking at FIG. 6 in more detail the embedded chip 616 is connected to a front side RDL 610 as a package substrate. The chip and the substrate are covered in a mold compound 618. The upper package has the ceramic substrate 624 and attached antenna 626. A shielding layer 632 has been applied on the bottom side of the ceramic substrate opposite the antenna. The shielding layer connects on one side through a solder interconnect 650 and a solder filled hole to the package substrate 610. Similarly, the antenna connects on the opposite side using through-ceramic vias 622. From the bottom side of the ceramic substrate, the antenna similarly connects through a solder filled via on the other side of the package to the packet substrate.

Figure 7:
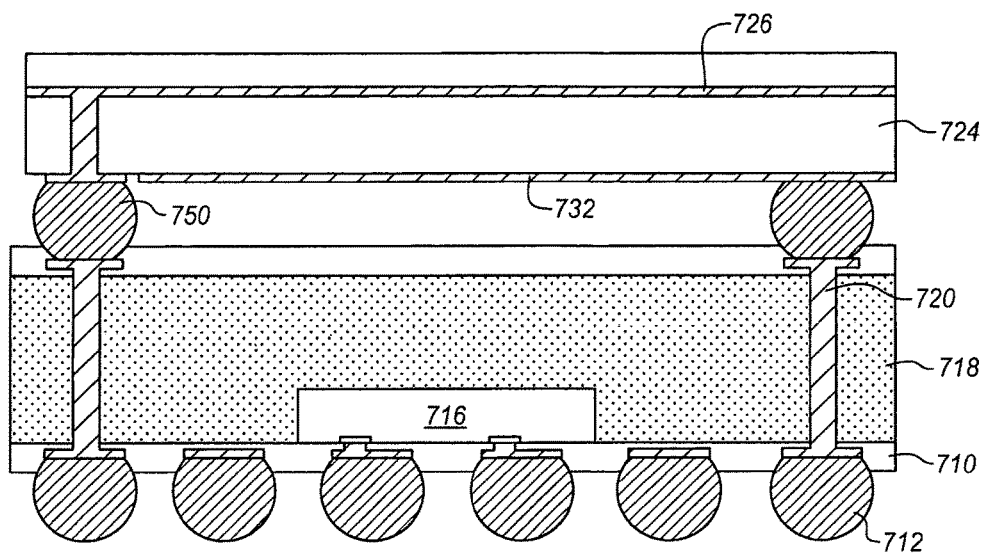
FIG. 7 is a cross-sectional side view diagram of an antenna on another alternative ceramic substrate stacked over an eWLB package according to an embodiment of the invention.

FIG. 7 shows a similar package in which the antenna 726 is embedded inside the ceramic substrate 724. The bottom package has a bottom package RDL or substrate 710 to carry the embedded chip 716 covered by a mold compound 718. Through-mold vias 720 connect from the package substrate up to the top of the package. Alternatively, solder filled through-mold holes may be used instead as shown in FIG. 6. The ceramic substrate top package connects to the solder ball connection 750 at the top of the bottom package. These solder ball connections allow for connections to a shielding layer on the bottom of the ceramic substrate and an antenna embedded within the substrate. Alternatively, in this and the examples of FIGS. 5 and 6, an RDL may be formed on one or both sides of the ceramic substrate.

A variety of different embodiments have been described in detail herein. In each case, the antenna is formed as metal lines on or in a ceramic substrate. The ceramic allows the quality factor of the antenna to be increased many fold. A major component of many package materials is polymide which has a relative permittivity of about 3.5. A copper trace antenna on polymide has a Q factor of about 20 at frequencies of about 3 GHz. Ceramic materials on the other hand may have a relative permittivity of about 10. A copper trace antenna on such a ceramic may have a Q factor of about 500. This provides a significant benefit in the quality of the signal and allows the antenna to be made substantially smaller. The much lower Q factor for the polymide is in part because the antenna has a strong capacitive coupling to the chip on the package. This is substantially reduced with the ceramic.

The Q factor of the antenna is improved with only a thin ceramic substrate. It is enough that the ceramic be about 10 μm thick. Such a thin layer may be difficult to produce and handle, so the ceramic substrate may be made much thicker while still providing the same or better benefits for the antenna. In some embodiments, the ceramic substrate may be as thick as 50 μm or even more up to and greater than 500 μm.

The ceramic and antenna combination may be used in a variety of different types of package configurations. As described herein, the combination may be added into a package that contains semiconductor, radio frequency, or other types of chips. FIGS. 1, 2, 3, and 4 show different variations of an eWLB package with the ceramic and antenna combination placed on top. The combination may be added into other types of packages as well. Alternatively, the ceramic and antenna combination may be stacked on other packages as if it is a separate package. FIGS. 5, 6, and 7 show different variations of a PoP structure with an eWLB bottom package, however, the ceramic and antenna combination can be stacked with other packages in other ways.

A number of different variations are described the illustrated examples, but these may be applied to other examples instead. Conductive shielding may be applied to a variety of different locations between the antenna and a die that is in the same package or in a nearby package. The shielding may be formed on the ceramic, on an interposer, on or in an RDL or within other places in the package or its cover material.

In the same way, the antenna, shown as the top layer in most of the illustrated examples, may be covered or protected in many different ways. The antenna may be subject to corrosion and to physical damage. These injuries may be prevented using coatings, films, and covers alone or in combination. In any one of the illustrated examples, the antenna may be covered with a metal such as Al, or Au. Dielectric coatings such as various oxides and polymers may also be used. In addition separate covers may be installed over any of the antennas shown or described herein.

Polymides, polybenzoxazole (PBO)-based dielectric materials, benzocyclobutene (BCB) based dielectric materials, and other polymer materials may be used as a cover layer over the antenna and as a cover layer under the antenna. FIG. 2 shows a dielectric layer both over and under the antenna between the antenna and the ceramic. One or both of these uses of dielectrics may be applied to any use of an antenna and ceramic combination. While FIGS. 4 and 7 show the antenna embedded within the ceramic, even with an embedded antenna, the antenna may be covered on one or more sides with a separate dielectric material such as a polymer. The ceramic may be used as an additional cover on the top side of the antenna. The cover may be formed separate from the main part of the ceramic and then attached over the antenna or it may be formed directly over the antenna and the main part of the ceramic.

Connections for the antenna and any shield may be made in a variety of different ways through silicon substrates, mold compound, through the ceramic or around some of these surfaces. Connections may also be made in other ways (not shown) such as through wire leads or external connectors.

The described ceramic and antenna combinations allow antennas to be integrated into packages with other components or stacked over other component packages. This reduces the number of parts and tasks for the assembly of a device and reduces the size of the antenna component combination. These combinations improve efficiency by bringing the antennas closer to the other components reducing power consumption. It also simplifies the system design because there is no need to design impedance matching antenna paths into a system. The antenna connections are designed into the component.

Figure 8A:
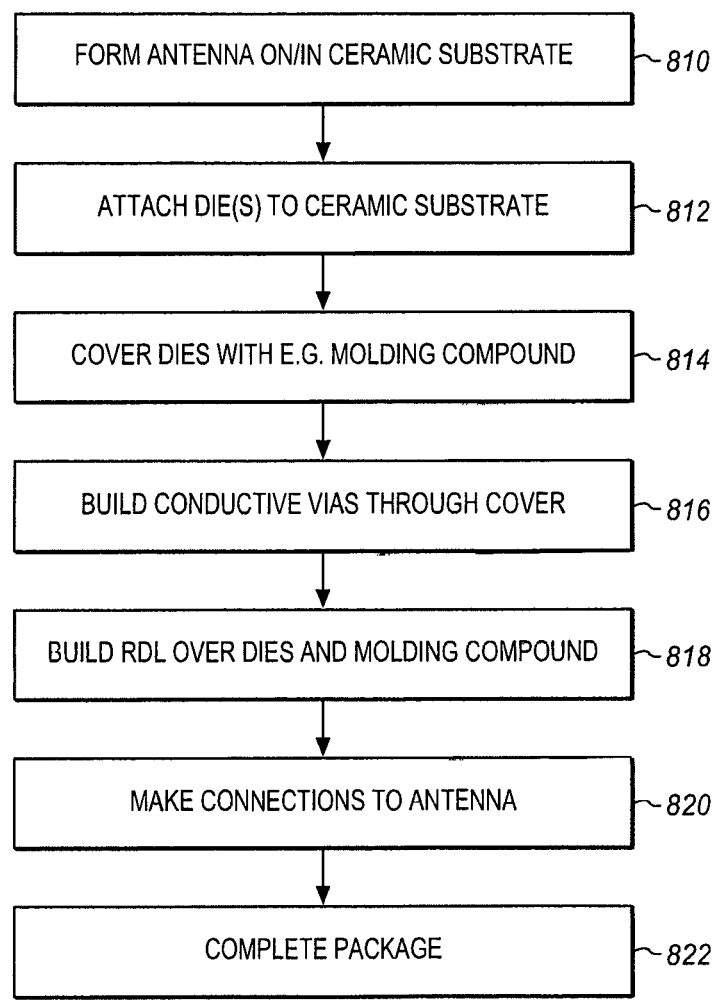
FIG. 8A is a process flow diagram of forming an eWLB package with an embedded antenna on a ceramic substrate according to an embodiment of the invention.

FIG. 8A shows a method of assembling a package with an antenna on embedded ceramic. First at 810 one or more antennas are formed on or in a ceramic substrate. The antennas may be formed by deposition, paste printing, or in a variety of other ways. The antenna or antennas may be attached by depositing conductive lines on a surface of the ceramic substrate. Antennas may be formed inside of the ceramic by forming the antenna on a part of the ceramic and then attaching a second part of the ceramic over the antenna. An example is LTCC technology. Alternatively, the ceramic may be formed around a metal antenna structure. As another alternative, the antenna may be formed as part of the backside RDL over the ceramic after the ceramic and die are packaged. Regardless of how it is formed the antenna may also be covered with a protective coating such as an anti-corrosion metal or a dielectric protective coating.

At 812 the ceramic substrate is attached to one or more dies. As described above, shielding layers may be used between the ceramic and the die. There may be electrical paths on the ceramic substrate on a side opposite the antenna and these may be isolated by a dielectric or with shielding or both.

At 814, a molding or filler is applied over the die and the ceramic substrate to protect the die from physical and other environmental impacts and at 816 vias are formed in the mold compound or filler as desired for the intended connections. The vias may be formed by first etching channels and then filling with copper or solder or in any of a variety of other ways.

At 818, a redistribution layer is formed over the die, the mold compound, and the ceramic with the antenna. The redistribution layer may have connections to the vias and the dies on one side. A contact array on the opposite side may be used for connection to a system board of a computing system or to other components. The redistribution layer may also have pitch translation and include pathways to connect the antenna to both the die and to system board.

Alternatively, the ceramic substrate may be treated as a separate package and applied over a package cover or an upper RDL associated with the die. At 820, the connections between the antenna and any other components or pads are made. The connections will include electrically connecting the antenna to the die through the package substrate. This package is now operational. The package may be made more secure by forming additional covers or protective material over the antenna and the dies.

Figure 8B:
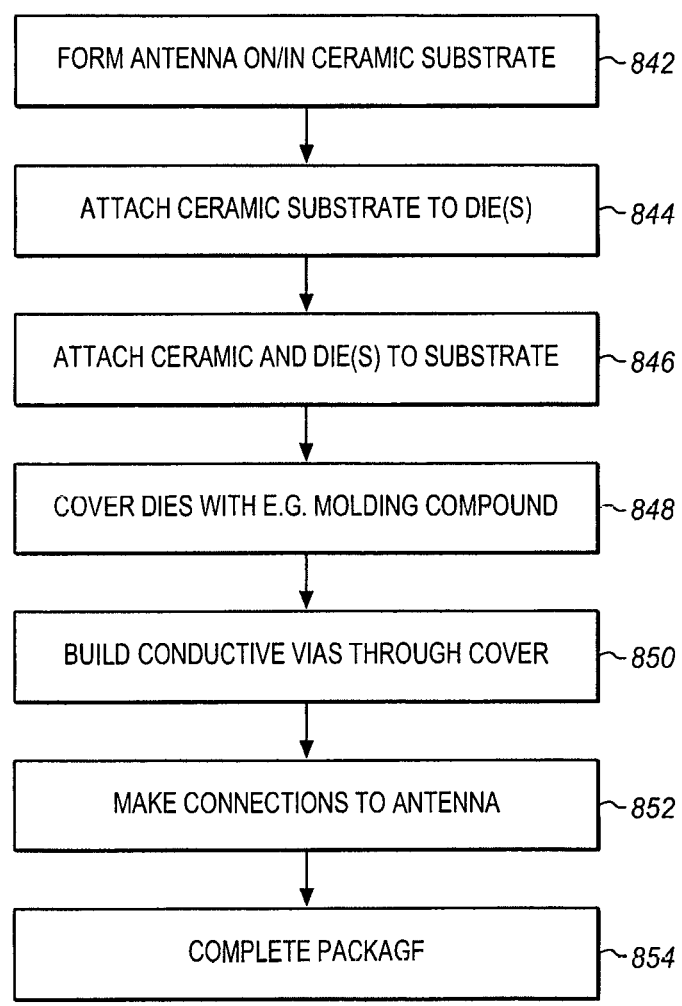
FIG. 8B is a process flow diagram of forming a flip-chip package with an embedded antenna on a ceramic substrate according to an embodiment of the invention.

As an alternative process, FIG. 8B begins at 842 with forming the antennas on or in the ceramic. At 844, the ceramic substrate is then attached, for example, with adhesive to one or more dies. At 846 the dies with the antenna substrate are attached to a package substrate. Such a process may be used, for example, for a flip chip package.

A cover, such as a mold compound, can be applied over the die(s) and antenna(s) at 848 and then conductive vias can be formed at 850 and connected to the antenna(s) at 852. The package can then be finished at 854.

Figure 9:
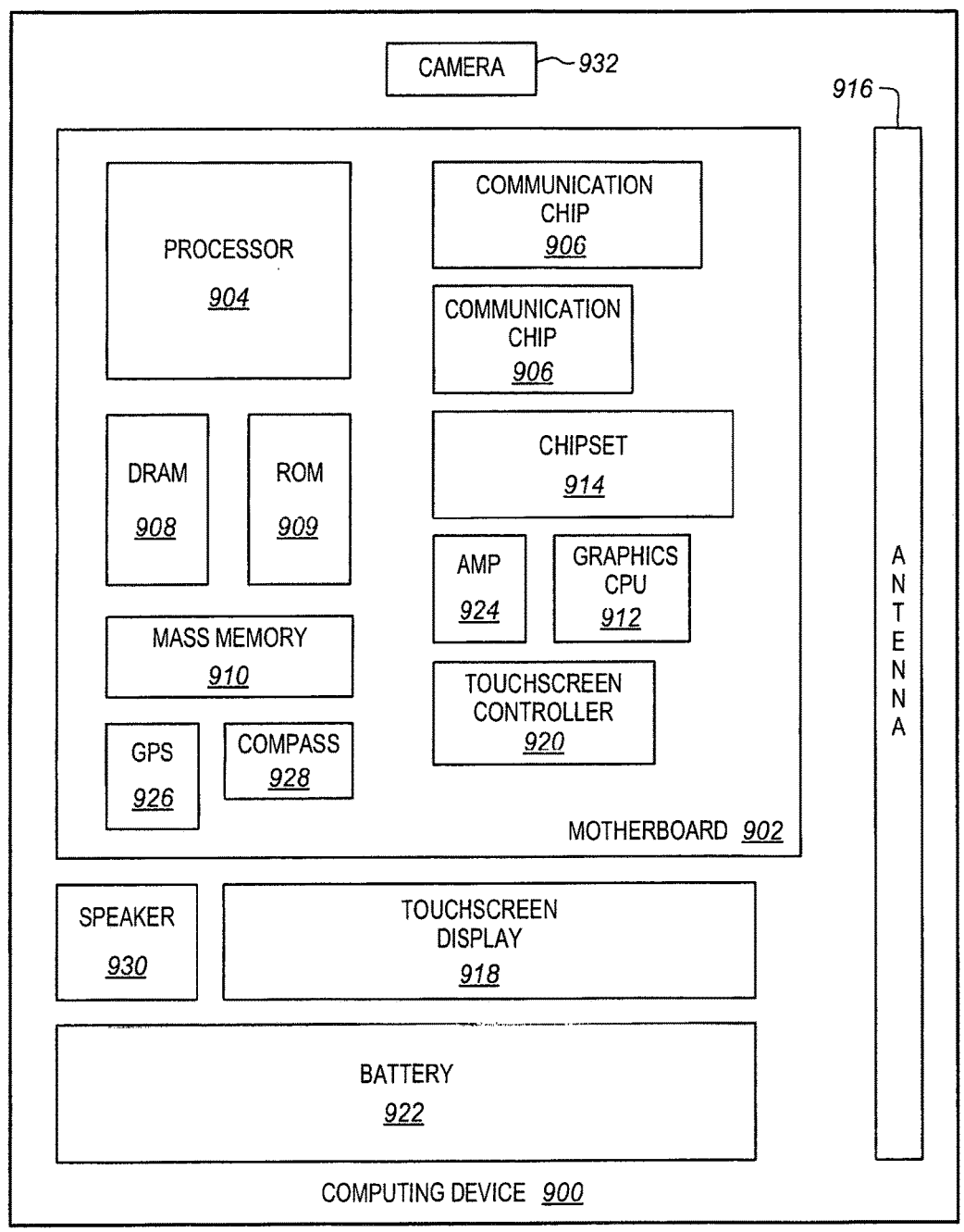
FIG. 9 is a block diagram of a computing device incorporating package with an antenna on a ceramic substrate according to an embodiment.

FIG. 9 illustrates a computing device 900 in accordance with one implementation of the invention. The computing device 900 houses a system board 902. The board 902 may include a number of components, including but not limited to a processor 904 and at least one communication package 906. The communication package is coupled to one or more antennas 916. The processor 904 is physically and electrically coupled to the board 902. At least one antenna 916 is integrated with a communication package 906 and is physically and electrically coupled to the board 902 through the package. In some implementations of the invention, any one or more of the components, controllers, hubs, or interfaces are formed on dies using through silicon vias as described above.

A packaged die 906, 924, 926 may connect to an antenna 916 that is within the package or in a package stack using the ceramic substrates as described. The antenna 916 of the block diagram represents each of these types of antenna locations and connections. It also represents all of the different types of antennas and antenna arrays that may be used by the device.

Depending on its applications, computing device 900 may include other components that may or may not be physically and electrically coupled to the board 902. These other components include, but are not limited to, volatile memory (e.g., DRAM) 908, non-volatile memory (e.g., ROM) 909, flash memory (not shown), a graphics processor 912, a digital signal processor (not shown), a crypto processor (not shown), a chipset 914, an antenna 916, a display 918 such as a touchscreen display, a touchscreen controller 920, a battery 922, an audio codec (not shown), a video codec (not shown), a power amplifier 924, a global positioning system (GPS) device 926, a compass 928, an accelerometer (not shown), a gyroscope (not shown), a speaker 930, a camera 932, and a mass storage device (such as hard disk drive) 910, compact disk (CD) (not shown), digital versatile disk (DVD) (not shown), and so forth). These components may be connected to the system board 902, mounted to the system board, or combined with any of the other components.

The communication package 906 enables wireless and/or wired communications for the transfer of data to and from the computing device 900. The term "wireless" and its derivatives may be used to describe circuits, devices, systems, methods, techniques, communications channels, etc., that may communicate data through the use of modulated electromagnetic radiation through anon-solid medium. The term does not imply that the associated devices do not contain any wires, although in some embodiments they might not. The communication package 906 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 900 may include a plurality of communication packages 906. For instance, a first communication package 906 may be dedicated to shorter range wireless communications such as Wi-Fi and Bluetooth and a second communication package 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a package that has a die, a ceramic substrate over the die, an antenna attached to the ceramic substrate, and conductive leads electrically connecting the antenna to the die. In some embodiments, the antenna is formed on a surface of the ceramic substrate. In some embodiments, the ceramic substrate has a first face facing the die and a second face opposite the die and the antenna is formed on the second face.

In some embodiments, the antenna is formed within the ceramic substrate. Some embodiments include a mold compound over the die and the conductive leads comprise through-mold vias from the antenna to the die. In some embodiments, the mold compound is over the ceramic substrate.

Some embodiments include a conductive shield between the die and the antenna. In some embodiments, the shield is between the die and the ceramic substrate. In some embodiments, the shield is attached to the ceramic substrate. In some embodiments the shield is grounded through a via to an external connection.

Some embodiments include a package substrate wherein at least a portion of the conductive leads are coupled to the package substrate. In some embodiments the conductive leads include routing paths in the package substrate. Some embodiments include a mold compound over the ceramic substrate and the die and the package substrate comprises a redistribution layer formed on a front side of the die and on the mold compound.

In some embodiments the ceramic substrate has a first face facing the die and a second face opposite the die and the antenna is formed on the second face, a shield is formed on the first face to isolate the antenna from the die, and a conductive trace is formed on a third face between the first face and the second face to electrically connect the antenna to a conductive lead proximate the first face.

Some embodiments include a package cover over the die between the die and the ceramic substrate, wherein the ceramic substrate has conductive pads coupled to the antenna, wherein the ceramic substrate is attached to the package cover using solder balls on the pads, and wherein the conductive leads comprise the pads and the solder balls.

In some embodiments the package cover comprises a redistribution layer having connections to a second die. In some embodiments the conductive leads comprise solder-filled vias.

Some embodiments pertain to a computing system with a processor, a user interface, and a communications chip in a package. The package has a die, a ceramic substrate over the die, an antenna attached to the ceramic substrate, a mold compound over the ceramic substrate and the die, a redistribution layer formed on a front side of the die and on the mold compound and conductive leads electrically connecting the antenna to the redistribution layer. Some embodiments include conductive paths on the ceramic substrate to connect the antenna on one side of the substrate to a via connected to an opposite side of the substrate.

Some embodiments pertain to a method with attaching an antenna to a ceramic substrate, attaching the ceramic substrate to a die, forming a cover over the die, forming a redistribution layer over the cover and the die, and electrically connecting the antenna to the die through the redistribution layer. In some embodiments attaching an antenna comprises depositing conductive lines on a surface of the ceramic substrate.

What is claimed is:

1. A package comprising:
    a die;
    a dielectric ceramic substrate over the die, the ceramic substrate having a thickness of at least 10 micrometers, wherein the dielectric ceramic substrate has a first surface facing the die, a second surface facing away from the die, and a sidewall surface connecting the first surface to the second surface;
    an antenna formed on the second surface of the ceramic substrate, wherein the antenna is positioned over the die, the antenna being positioned such that the dielectric of the ceramic increases the resonant frequency of the antenna;
    a conductive shield layer between the first surface of the ceramic substrate and the die;
    conductive leads electrically connecting the antenna to the die; and
    a mold compound over the die and completely covering the sidewall surface of the ceramic substrate.

2. The package of claim 1, wherein the shield layer is formed on the first surface of the ceramic substrate.

3. The package of claim 1, wherein the conductive leads comprise through-mold vias from the antenna to the die.

4. The package of claim 1, wherein the shield is grounded through a via to an external connection.

5. The package of claim 1, further comprising a package substrate attached to the die and wherein at least a portion of the conductive leads are coupled to the die through the package substrate.

6. The package of claim 5, wherein the conductive leads include routing paths in the package substrate.

7. The package of claim 5, further comprising a mold compound over the ceramic substrate and the die and wherein the package substrate comprises a redistribution layer on a front side of the die and on the mold compound.

8. The package of claim 1, wherein the shield layer on the first surface is to isolate the antenna from the die, the package further comprising a conductive trace on a third surface of the ceramic substrate between the first surface and the second surface to electrically connect the antenna to a conductive lead proximate the first surface.

9. The package of claim 1, further comprising a package cover over the die between the die and the ceramic substrate, wherein the ceramic substrate has conductive pads coupled to the antenna, wherein the ceramic substrate is attached to the package cover using solder balls on the pads, and wherein the conductive leads comprise the pads and the solder balls.

10. The package of claim 9, wherein the package cover comprises a redistribution layer having connections to a second die.

11. The package of claim 9, wherein the conductive leads comprise solder-filled vias.

12. The package of claim 1, wherein the dielectric ceramic substrate has a loss tangent of less than 0.005.

13. A computing system comprising:
    a processor;
    a user interface; and
    a communications chip in a package, the package having a die, a dielectric ceramic substrate over the die, the ceramic substrate being a having a thickness of at least 10 micrometers, wherein the dielectric ceramic substrate has a first surface facing the die, a second surface facing away from the die, and a sidewall surface connecting the first surface to the second surface, an antenna formed on the second surface of the ceramic substrate, the antenna being positioned such that the dielectric of the ceramic increases the resonant frequency of the antenna, a conductive shield layer between the first surface of the ceramic substrate and the die, a mold compound over the die and completely covering the sidewall surface of the ceramic substrate, a redistribution layer formed on a front side of the die and on the mold compound and conductive leads electrically connecting the antenna to the redistribution layer.

14. The computing system of claim 13, further comprising conductive paths on the ceramic substrate to connect the antenna on the second surface of the substrate to a via connected to the first surface of the substrate.

15. The computing system of claim 13, further comprising a conductive trace on a third surface of the ceramic substrate between the first surface and the second surface to electrically connect the antenna to the conductive lead proximate the first surface.

16. A method comprising:
    forming a dielectric ceramic substrate with a thickness of at least 10micrometers, wherein the dielectric ceramic substrate has a first surface, a second surface, and a sidewall surface connecting the first surface to the second surface;
    attaching an antenna to the second surface of the ceramic substrate, the antenna being attached such that the dielectric of the ceramic increases the resonant frequency of the antenna;
    applying a conductive shield layer on the first surface of the ceramic substrate;
    attaching the ceramic substrate to a die, wherein the first surface of the ceramic substrate is facing the die, and the second surface of the ceramic substrate is facing away from the die;
    forming a cover over the die and completely covering the sidewall surface of the ceramic substrate;

forming a redistribution layer over the cover and the die; and electrically connecting the antenna to the die through the redistribution layer.

17. The method of claim 16, wherein attaching an antenna comprises depositing conductive lines on a surface of the ceramic substrate.

18. The method of claim 17, wherein forming a cover comprises applying a mold compound over the ceramic substrate and the die and wherein forming a redistribution layer comprises forming a redistribution layer on a front side of the die and on the mold compound.

\* \* \* \* \*